United States Patent [19]

Crooks

[11] Patent Number: 4,496,859
[45] Date of Patent: Jan. 29, 1985

[54] NOTCH FILTER SYSTEM

[75] Inventor: Robert C. Crooks, Huntington Beach, Calif.

[73] Assignee: Barcus-Berry, Inc., Huntington Beach, Calif.

[21] Appl. No.: 430,850

[22] Filed: Sep. 30, 1982

[51] Int. Cl.³ .................... H03H 11/12; H03H 11/16
[52] U.S. Cl. .................... 307/520; 307/516; 307/529; 328/167; 330/302; 330/306
[58] Field of Search .............. 307/510, 514, 516, 520, 307/521–523, 525–526, 529, 271; 328/21, 134, 138, 141, 167; 330/107, 109, 192, 294, 302, 306

[56] References Cited

U.S. PATENT DOCUMENTS

| | | | |
|---|---|---|---|
| 3,831,117 | 8/1974 | Fletcher et al. | 330/302 |
| 3,838,351 | 9/1974 | Hekimian | 330/107 X |
| 3,936,777 | 2/1976 | Rollett et al. | 330/302 |
| 3,936,830 | 2/1976 | Overbury | 328/167 X |
| 4,051,385 | 9/1977 | Greenaway et al. | 307/520 |
| 4,107,622 | 8/1978 | Toyomaki | 330/294 X |
| 4,195,265 | 3/1980 | Vali | 328/167 |
| 4,215,280 | 7/1980 | Mahig | 307/520 X |
| 4,245,202 | 1/1981 | Huntley | 307/520 X |

OTHER PUBLICATIONS

Soliman et al., "A Universal Notch Filter", Circuit Theory and Applications, vol. 7, Wiley & Sons Ltd., Jan., 1979, pp. 139–142.

Clark, "Cancel 60 Hz and Other Noise", Electronic Design, vol. 20, Sep. 1976, pp. 74–79.

Panicker, "Simulated Inductance for Low Frequency Filter", Electronic Engineering, Nov., 1976, p. 19.

Haussmann et al., "Variable Filter Characteristics with an OP AMP", Electronic Engineering, Feb. 1972, pp. 41–42.

Primary Examiner—Stanley D. Miller
Assistant Examiner—David R. Hudspeth
Attorney, Agent, or Firm—Albert L. Gabriel

[57] ABSTRACT

A notch filter system for eliminating a specific "stop" frequency from an AC electrical input signal, such as 60 Hz "hum" from an audio program signal. An L/C tuned circuit that is tuned to the stop frequency is used to develop a modified input signal that is in phase with the input signal only at the stop frequency. The two signals are amplitude-balanced and fed to the respective inputs of a balanced differential amplifier which is responsive to both input signal phase and amplitude differences so as to cancel the signals at the stop frequency where they have the same phase and amplitude but not at frequencies above and below the stop frequency where they differ in phase and amplitude.

28 Claims, 5 Drawing Figures

NOTCH FILTER SYSTEM

BACKGROUND OF THE INVENTION

1. Field of the Invention

The present invention is in the field of notch or band stop filters, and it relates particularly to such notch filters which may be employed in connection with audio systems to eliminate or reduce 60 Hz "hum" and sometimes also harmonics thereof.

2. Description of the Prior Art

60 Hz "hum" problems are common in audio equipment, and are particularly troublesome in television and radio broadcasting, recording studios and commercial sound systems where the audio equipment is of very high quality and its sensitivity tends to make it responsive to spurious signals. This problem is frequently caused by low level audio program cables which may lie in close proximity to high current power line cables such as, for example, big 100 to 300 amp studio lighting cables. In many cases, this proximity between audio program cables and power line cables, and consequent crossover of 60 Hz "hum" and some harmonics into audio cables, is difficult to avoid and would consume expensive time in attempts to locate the source of the problem and correct the problem by mechanical separation of cables.

A simple answer to this problem would be the insertion of a notch filter tuned to 60 Hz in any audio line which may be vulnerable to 60 Hz "hum", and also to insert one or more notch filters tuned to harmonics of 60 Hz as may be required in vulnerable audio lines. However, prior to the present invention there has been no line notch or band stop filter available that had a sufficiently narrow stop band to avoid causing a large and intolerable hole in the low frequency response, or in the case of harmonics to avoid causing a large gap in the midrange response. Also, the typical state-of-the-art notch or band stop filter did not provide sufficient attenuation to completely remove 60 Hz "hum" and its harmonics from high quality audio equipment.

Thus, the typical prior art line notch filter had a stop bandwidth of about 30% of the stop frequency, with a response curve slope no steeper than about 100 db per octave and an attenuation of about 30 db. The best prior art notch filters still had a bandwidth of at least about 25% of the stop frequency and a response curve slope up to about 150 db per octave for active notch filters and up to not more than about 500 db per octave for passive notch filters, with an attenuation of as much as about 50 db; however such notch filters were very bulky or involved extensive circuitry, and they were expensive. The bandwidth of a notch filter is considered in the art to be the bandwidth between the "corner frequencies" on the response curve below and above the stop frequency at the points where the filter produces an attenuation of 3 db. The prior art line notch filter attenuation bandwidth of approximately 25%–30% of the stop frequency results in a bandwidth of approximately 15–18 Hz for the 60 Hz "hum" stop frequency, and the resulting 15–18 Hz low frequency hole in the response of the system causes such prior art notch filters to be totally unacceptable for high quality audio systems. Often, 2nd, 3rd and 4th harmonics are involved in the 60 Hz "hum" problem, and if such a prior art notch filter with a 25%–30% bandwidth were tuned to the 4th harmonic, which is 240 Hz, a wide band of 60–72 Hz would be essentially removed from the middle of the midrange, which again would be totally unacceptable.

It is recognized that some hybrid circuits have been developed for telephone equipment which provide attenuation slopes up to approximately 300 db per octave, however, such hybrids are not adaptable to the notch filter situation, as they are either low pass or high pass filters only, and they are very expensive.

SUMMARY OF THE INVENTION

In view of these and other problems in the art, it is a general object of the present invention to provide a notch or band stop filter having response characteristics that are greatly superior to the response characteristics of prior art notch or band stop filters.

Another general object of the invention is to provide a notch or band stop filter which produces such a high attenuation at the stop frequency with such a narrow stop band proximate the stop frequency that the filter is fully compatible with high quality audio systems for substantially completely eliminating 60 Hz "hum" and also such distortion harmonics as may accompany such 60 Hz "hum".

Another object of the invention is to provide an active notch or band stop filter system which is capable of reliably producing an attenuation at the stop frequency of 50 db or greater, even with the use of standard quality circuit components.

A further object of the invention is to provide an active notch or band stop filter system which has response curve slopes at opposite sides of the stop frequency that are extremely steep, being greater than approximately 1,000 db per octave, whereby the very high attenuation of the system is producible with an extremely narrow stop band of less than 7% of the stop frequency.

A still further object of the invention is to provide an active line notch or band stop filter which does not require bulky circuit components or extensive circuitry, and is therefore suitable for manufacture in compact, miniature form, and is inexpensive to produce.

The notch filter of the present invention is preferably arranged as a "line" notch filter adapted to be inserted into any electrical cable or line that carries, or is likely to carry, some particular undesired frequency content. Typically, such line or cable will be an audio program cable or line wherein it is desired to eliminate any 60 Hz "hum" or possibly one or more harmonics of such 60 Hz "hum". In an audio system having a mixing board, one or more notch filters according to the present invention may advantageously be placed in series with one of the main lines out of the mixing board.

According to the invention, a voltage divider consisting of a resistor and an L/C parallel tuned circuit is connected to the input terminal of the notch filter, the divider having an output junction between the resistor and the L/C tuned circuit at which junction there will be a modified AC program voltage signal which peaks in value at the resonant frequency of the L/C tuned circuit. If the notch filter is adapted for elimination of 60 Hz "hum", then the L/C filter will be tuned to a resonant frequency of 60 Hz. The modified program signal is fed through a voltage adjuster such as a potentiometer to one input of a balanced differential operational amplifier, while the unmodified program signal is fed from the input terminal to the other input of the differential amplifier. The voltage adjuster is an external adjustment, and the system is balanced by adjusting this voltage adjuster until the AC voltage applied to the two inputs of the differential amplifier are equal for the stop frequency, such as 60 Hz, to which the L/C circuit is tuned.

Normally one working at this art would expect the filter response curve to approximate the inverted bandpass response curve of the L/C tuned circuit, inasmuch as such is the approximate configuration of the response curves of typical prior art state-of-the-art active line notch filters. However, for only a very small attenuation of the modified program signal by the L/C tuned circuit in the voltage divider configuration, such as only about 5 db, which corresponds to a very narrow bandwidth, such as less than about 7% of the stop frequency (less than 4.2 Hz for a 60 Hz stop frequency), there is a major phase shift on each side of the stop frequency. Thus, for this small, approximately 5 db attenuation and narrow approximately 7% or less bandwidth, there will be a phase shift of approximately 60° on each side of the stop frequency. The balanced differential operational amplifier will substantially completely cancel the program signal, including the unwanted, spurious portion, at the stop frequency such as 60 Hz at which the AC voltage inputs to the differential amplifier are balanced. However, the differential operational amplifier is sensitive not only to voltage differentials at its inputs, but also to phase differentials at its inputs, so that although the voltage differential may be relatively small for the approximately 5 db drop, the accompanying large phase differential will result in the differential amplifier causing substantially zero program signal cancellation. Thus, it is the high sensitivity of the system of the present invention to the inductor and capacitor phase shifts which enables the surprisingly large attenuation and accompanying narrow bandwidth of the system to be achieved.

In one form of the invention, a real inductor, such as a choke, is employed, and a voltage follower is disposed between the L/C circuit and the adjusting or balancing potentiometer to prevent loading of the L/C circuit by the potentiometer. In another form of the invention an "active inductor" is employed to eliminate the bulk of a real inductor, and such active inductor includes back-to-back differential operational amplifiers one of which is arranged as a voltage follower between the L/C circuit and the adjusting or balancing potentiometer.

BRIEF DESCRIPTION OF THE DRAWINGS

These and other objects of the invention will become more apparent in view of the following description taken in conjunction with the drawings, wherein.

DETAILED DESCRIPTION

Figure 1:
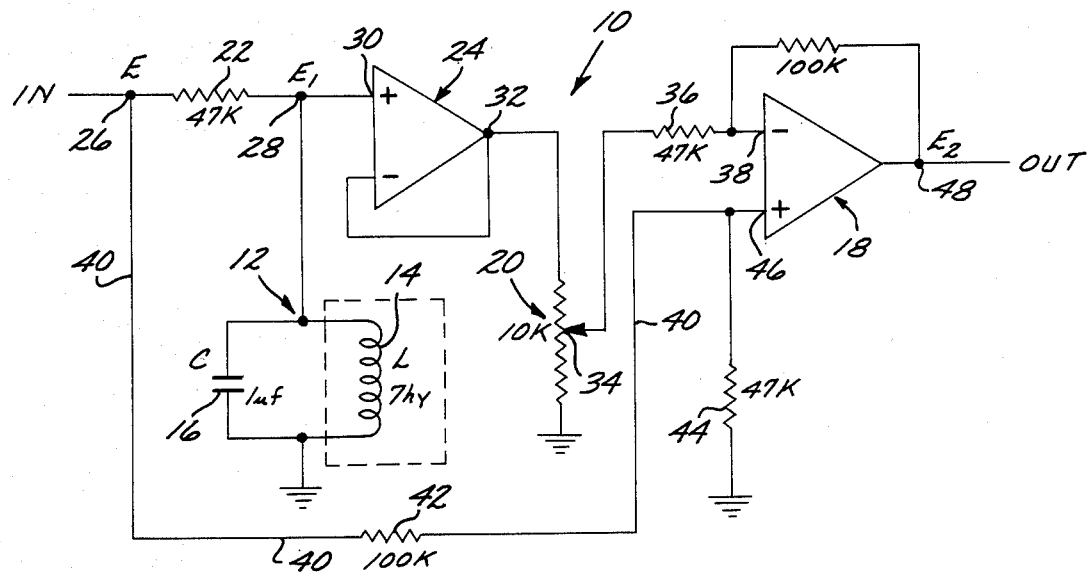
FIG. 1 is a circuit diagram showing one form of the invention in which the inductor component of the L/C tuned circuit is a real inductor such as a choke.

Referring to the drawings, FIG. 1 illustrates a first form of the invention wherein the inductor component of the L/C parallel tuned circuit is a passive inductor. The active line notch filter or band stop filter of FIG. 1 is generally designated 10. Its primary operational components are the L/C parallel tuned circuit 12 which is composed of inductor and capacitor components 14 and 16, respectively, and a balanced differential amplifier 18. The L/C tuned circuit 12 is tuned to the desired "stop" or rejection frequency, which will usually be the 60 Hz AC power source frequency.

Other circuit components of the active notch filter 10, which cooperate with the L/C tuned circuit 12 and differential amplifier 18, include a balancing potentiometer 20 for balancing the amplitudes of the voltage signal inputs to the differential amplifier 18, a voltage divider resistor 22 which is in a voltage divider configuration with the L/C tuned circuit 12, and a voltage follower 24 which is electrically connected between the L/C circuit 12 and the potentiometer 20 to avoid loading of the L/C circuit.

The active notch filter 10 of the invention is adapted to be series-connected in any program cable or line which, in addition to the program signal, is liable to also be conducting a particular unwanted, spurious signal, typically such cable or line will be an audio cable or line, and the spurious signal will be 60 Hz "hum" derived from one or more high current power cables or lines which come into close proximity to the audio cable or line at one or more locations. Thus, in such series connection of the notch filter 10 in an audio cable or line, the input terminal 26 of notch filter 10 will have an AC program signal voltage E applied thereto as indicated in FIG. 1. The input terminal 26 is connected to one side of the voltage divider resistor 22 so that the input is connected to the upper end of the voltage divider that consists of resistor 22 and L/C tuned circuit 12. At the lower end of this voltage divider the L/C tuned circuit 12 is connected to ground.

Figure 3:
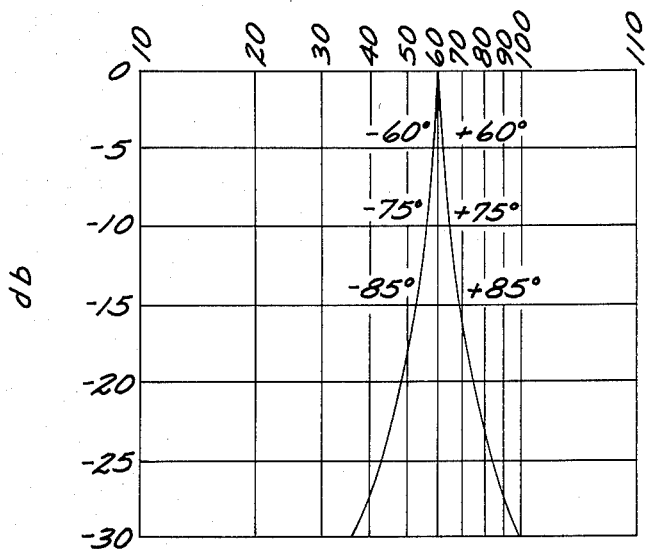
FIG. 3 shows the bandpass response curve for the L/C tuned circuit in either FIG. 1 or FIG. 2.

The voltage divider junction 28 between resistor 22 and tuned circuit 12 has a voltage signal $E_1$ thereon which may be considered to be a modified AC program signal voltage. With the voltage divider resistor 22 having a resistance value of R ohms, and the impedance of tuned circuit 12 having a value of Z ohms, then $E_1$ is approximately equal to $Z/R \times E$. Considering the input signal E as spurious 60 Hz "hum" signal, with the L/C parallel circuit 12 tuned to a resonant frequency of 60 Hz, the impedance of L/C circuit 12 is highest and hence the value of $E_1$ highest and closest to the value of E at this 60 Hz stop frequency. The value of voltage divider resistor 22 relative to the values of the inductor and capacitor components 14 and 16, respectively, of the L/C tuned circuit determines the resonant slope of the L/C circuit 12. The values given by way of illustration in FIG. 1 for the circuit components will provide a bandpass response curve for the L/C tuned circuit 12 having resonant slopes like those shown in FIG. 3 of the drawings. Utilizing such an L/C resonant circuit in a notch or band stop filter, one would expect to obtain a filter circuit response approximating the curve of FIG. 3 inverted, and this would represent an even poorer response than the typical prior art active notch filter response curve such as that shown in FIG. 5.

Returning to FIG. 1, the voltage divider junction 28 is connected to the noninverting input 30 of voltage follower 24, the output 32 of which is connected to the upper end of potentiometer 20, the lower end of which is connected to ground. The adjustable contact 34 of potentiometer 20 is connected through an input resistor 36 to the inverting input 38 of the balanced differential amplifier 18. Thus, the modified AC program signal voltage $E_1$ is delivered from voltage divider junction 28 through voltage follower 24 to inverting input 38 of differential amplifier 18, with its amplitude being adjustable by means of the potentiometer 20. The unmodified program signal E is delivered from input terminal 26 through a conductor 40 and an input network consisting of resistors 42 and 44 to the non-inverting input of balanced differential amplifier 18. The output 48 of differential amplifier 18 will thus provide to the line in which the notch filter 10 is connected a resultant program signal $E_2$.

Figure 4:
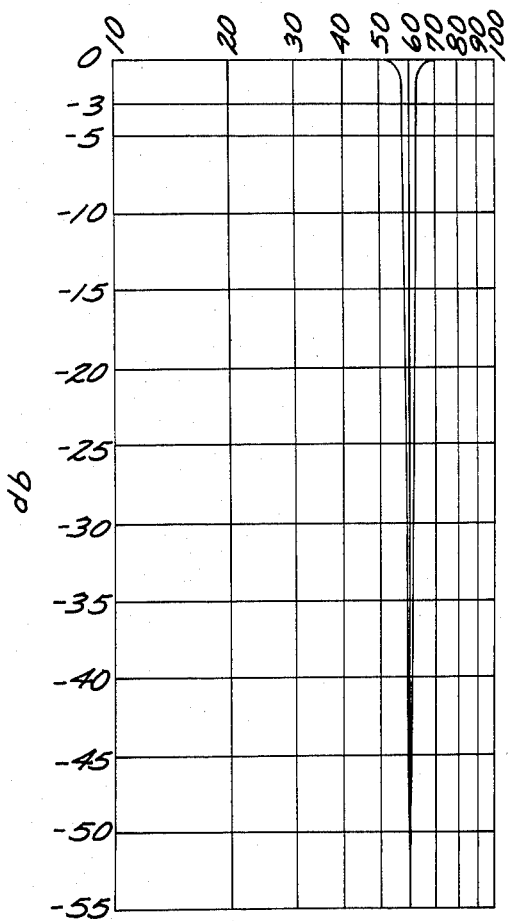
FIG. 4 shows the response curve for an active line notch filter embodying the present invention.
Figure 5:
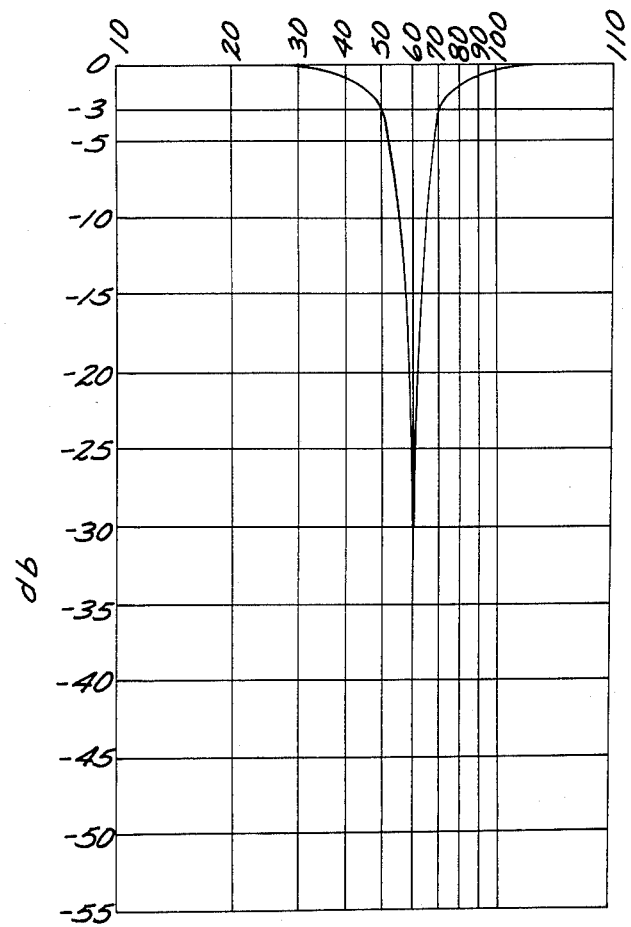
FIG. 5 shows the response curve of a typical prior art active line notch filter.

The balanced differential amplifier 18 cooperates with the L/C parallel tuned circuit 12 in a novel and unexpected way to produce an attenuation "notch" at the stop frequency (e.g., 60 Hz) in the output program signal $E_2$ like that shown in the filter response curve of FIG. 4 having improved characteristics of a different order of magnitude then the characteristics of the attenuation "notch" provided by a typical state-of-the-art notch filter which has a response curve like that shown in FIG. 5. Thus, the bandwidth of the "notch" produced by the present invention, utilizing circuit components of standard quality, is reliably less than 7% of the stop frequency, or less than only 4.2 Hz for the 60 Hz stop frequency; whereas the bandwidth for a conventional state-of-the-art notch filter is considered good when it is approximately 30% of the stop frequency, or approximately 18 Hz for the 60 Hz stop frequency. These bandwidths are measured between the $-3$ db "corner frequency" points on the respective curves. The "notch" attenuation achieved by the present invention, using standard quality components, is reliably 50 db or more, which is less than 1/300th of the stop frequency amplitude originally present in the program signal; whereas the attenuation provided by a typical state-of-the-art notch filter is only about 30 db, which represents a stop frequency signal reduction to about 1/30th of its original amplitude, and this is insufficient to remove audible hum in many instances. The slopes of the sides of the "notch" produced by the present invention are over 1,000 db per octave; whereas the typical state-of-the-art notch filters produce "notch" slopes that are not more than about 150 db per octave.

In operation, the circuit of the present invention utilizes the characteristic of the L/C parallel tuned circuit 12 that it causes a large signal phase shift for only a very small frequency variation on either side of the stop frequency, and despite the fact that the accompanying impedance drop in the L/C circuit 12 for such frequency variations from the stop frequency is only relatively small. The differential operational amplifier 18 is responsive both to signal amplitude differentials at its inputs and to signal phase differentials at its inputs, and the differential amplifier 18 is arranged in the circuit to be fully responsive to the major phase shift as well as the minor amplitude reduction in the modified program signal $E_1$ relative to the incoming program signal E for such small frequency deviations from the stop frequency. This enables the circuit of the present invention to produce the very large (50 db or greater) yet very narrow (less than 4.2 Hz) notch shown in FIG. 4 while working in only the very small upper tip (the upper 5 db) of the bandpass response curve for the L/C circuit 12 shown in FIG. 3.

Assuming the stop frequency of the circuit 10 to be 60 Hz, at this frequency the modified program signal $E_1$ that is applied to the inverting input 38 of differential amplifier 18 is in phase with the incoming program signal E that is applied to the non-inverting input 46 of differential amplifier 18. The potentiometer 20 is adjusted so that the amplitude of the 60 Hz component of modified signal $E_1$ applied to differential amplifier input 38 is equal to the amplitude of unmodified signal E that is applied to differential amplifier input 46. The potentiometer 20 is externally adjustable for such voltage balancing, and it is the only external adjustment required for the system. With the 60 Hz AC voltages applied to the differential amplifier inputs 38 and 46 equal and in phase, they are completely cancelled in the differential amplifier 18, and the output program signal $E_2$ at the differential amplifier output 48 contains no 60 Hz component. In practice, the 60 Hz output component from differential amplifier 18 will not be exactly zero, due to circuit component tolerances and because there is a maximum common mode rejection (CMR) ratio of the operational amplifier chip of approximately 85 db. However, the 60 Hz output component is so close to zero that it makes no difference. It is because of the tolerances of the circuit components and this common mode rejection ratio of the operational amplifier chip that the present invention produces a 50 db or greater notch as shown in FIG. 4 instead of an even larger notch.

In practice, the 60 Hz amplitude levels applied to the two inputs of differential amplifier 18 can be balanced by simply adjusting the potentiometer 20 until no 60 Hz hum can be detected in an audio system having the notch filter 10 in its program cable or line. If desired, the notch depth may be adjusted by adjusting the potentiometer 20 to either side of the balanced condition, which will cause a reduction in the notch depth.

For frequencies less than approximately 2.1% below or above the 60 Hz stop frequency, which is the frequency range of the less than 7% or 4.2 Hz bandwidth consistently achievable by the present invention, the amplitude of the modified program signal $E_1$ applied to input 38 of differential amplifier 18 is still only down approximately 5 db from the amplitude of the unmodified program signal E applied to the input 46 of differential amplifier 18. This will be apparent from the upper portion of the L/C bandpass response curve of FIG. 3. However, for such very small frequency difference on either side of the 60 Hz stop frequency, there is a phase shift of approximately 60° in the modified program signal $E_1$ applied to the differential amplifier input 38 relative to the unmodified program signal E applied to the differential amplifier input 46 and this large phase difference between the signals applied to the inputs of differential amplifier 18 causes the cancellation effect in the differential amplifier 18 to be substantially eliminated, being reduced to approximately the $-3$ db level indicated on the filter circuit response curve of FIG. 4.

The use of a real choke for the inductor 14 of L/C tuned circuit 12 has two disadvantages. First, such an inductor is necessarily large and heavy, and limits overall miniaturization of the notch filter 10. This disadvantage can be overcome by using an "active inductor" such as that employed in the form of the invention shown in FIG. 2 in place of the real inductor 14 diagrammatically illustrated in FIG. 1. The second disadvantage of the use of a real inductor 14 in the L/C circuit 12 is that it requires the addition of the voltage follower 24 between the L/C circuit 12 and the potentiometer 20 to prevent loading of the inductor 14 by the potentiometer 20; otherwise, the resonant frequency impedance of the L/C circuit 12 could not be any higher than the resistance value of the potentiometer 20. The voltage follower 24 looks into a high impedance input and a low impedance output, completely isolating the L/C circuit from any loading effect from the potentiometer 20.

Figure 2:
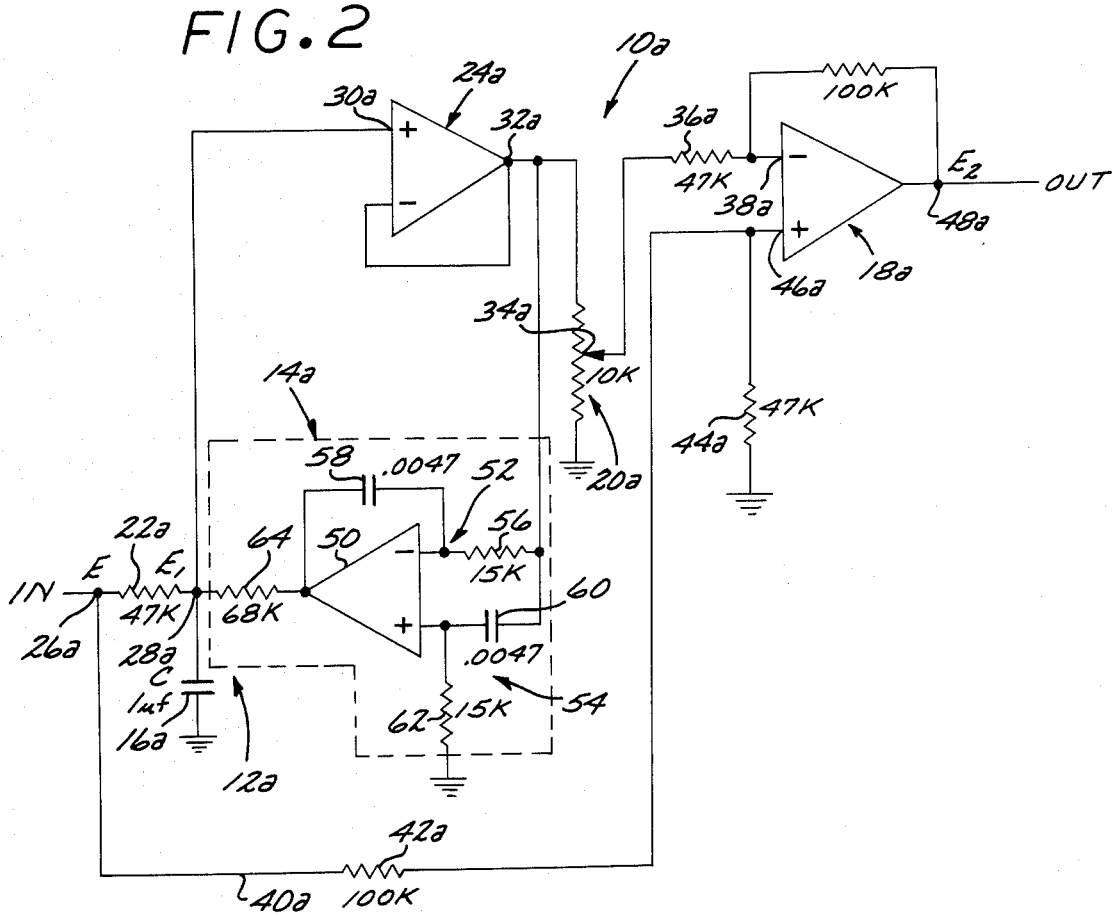
FIG. 2 is a circuit diagram similar to the diagram of FIG. 1, wherein the inductor component of the L/C circuit is an active or artificial inductor.

Referring now to FIG. 2, the active notch filter 10a has essentially the same overall circuit arrangement as the active notch filter 10 of FIG. 1, except for the fact that the inductor component of the L/C parallel tuned circuit is an active inductor generally designated 14a instead of a passive inductor as in the form of FIG. 1. Such an active inductor conventionally includes back-to-back operational amplifiers, one of which is set up as a voltage follower. Inasmuch as this voltage follower is in the same circuit position as the voltage follower 24 in the circuit of FIG. 1, it has been designated 24a in FIG. 2 and shown located outside of the dotted line block generally representing the active inductor 14a.

The active inductor 14a is a type of circuit well known in the art, so the detailed operation of its individual parts does not form a part of the present invention. In addition to the voltage follower 24a, which is a differential operational amplifier, the active inductor 14a also includes a differential operational amplifier 50 arranged in back-to-back circuit relationship relative to the voltage follower operational amplifier 24a. The differential operational amplifier 50 has phase shifting networks 52 and 54 associated with its respective inverting and non-inverting inputs; the phase shifting network 52 consisting of a resistor 56 and capacitor 58, and the phase shifting network 54 consisting of a capacitor 60 and resistor 62. This resistor 62 represents the low side of the active inductor 14a, being connected between the non-inverting input of differential amplifier 50 and ground. The active inductor amplifier 50 has an output resistor 64 which is at the high side of the active inductor 14a, being connected between the output of amplifier 52 and voltage divider junction 28a. While one side of resistor 56 is connected to the inverting input of amplifier 50 and one side of capacitor 60 is connected to the non-inverting input of amplifier 50, the other sides of both of these circuit components are connected to the output of voltage follower amplifier 24a.

It is thus seen that the active inductor component 14a of L/C parallel tuned circuit 12a is connected between voltage divider junction 28a and ground. Likewise, the capacitor component 16a of L/C tuned circuit 12a is connected between voltage divider junction 28a and ground, so as to be arranged in parallel relationship with the active inductor 14a.

Other than the active inductor 14a and its connection to voltage follower 24a, the notch filter circuit 10a of FIG. 2 is the same as the notch filter circuit 10 of FIG. 1. Thus, the filter circuit 10a includes a balanced differential amplifier 18a and an amplitude balancing potentiometer 20a in the same circuit locations as the corresponding circuit components of the notch filter 10 in FIG. 1. The L/C parallel tuned circuit 12a is connected in a voltage divider network with voltage divider resistor 22a that is connected between input terminal 26a and voltage divider junction 28a. The voltage divider junction 28a, which represents the voltage divider output, is connected to the noninverting input 30a of voltage follower 24a, the output 32a of the latter being connected to the high side of balancing potentiometer 20a, the low side of which is connected to ground. The adjustable contact 34a of potentiometer 20a is connected through input resistor 36a to the inverting input 38a of differential operational amplifier 18a. Conductor 40a connects the input terminal 26a of the notch filter circuit 10a through an input resistor network consisting of resistors 42a and 44a to the non-inverting input 46a of differential amplifier 18a. The output of differential amplifier 18a is connected to the output terminal 48a of the notch filter circuit 10a.

The active notch filter 10a of FIG. 2 is adjusted in the same way and operates in the same way as the active notch filter 10 of FIG. 1, such adjustment and operation having been described in detail hereinabove.

By way of example only, and not of limitation, the operational amplifiers 18 and 24 of FIG. 1 and 18a and 24a of FIG. 2 may be any standard operational amplifiers, as for example a standard 741 operational amplifier or equivalent. While values for the various circuit components are indicated on the circuit diagrams of FIGS. 1 and 2, it is also to be understood that such circuit component values are given by way of example only and not of limitation.

The present invention is the only notch or band stop filter system of which the applicant is aware that is usable in connection with high quality audio systems for substantially completely eliminating 60 Hz "hum" and its harmonics. The 50 db or greater "notch" reliably achievable by the present invention with standard quality components is capable of substantially completely eliminating 60 Hz "hum" in the highest quality audio equipment, even in "worst case" situations such as in television broadcasting studios wherein a number of audio cables and big 100 to 300 amp lighting cables are frequently intermingled. The only about 30 db typical attenuation achievable by state-of-the-art active notch filters is insufficient to substantially completely remove the 60 Hz "hum" and its harmonics from such high quality audio systems, so that despite the use of such filters the "hum" can still be heard.

However, it is not the amount of attenuation that makes conventional state-of-the-art active notch filters unusable in high quality audio systems, but it is the fact that the wide approximately 30% bandwidth leaves a big hole of approximately 18 Hz in a low frequency region where good response is important. The less than 7% (4.2 Hz) bandwidth of the present invention leaves no detectable gap in the low frequency response of even highest quality audio equipment.

In many instances, 2nd, 3rd and 4th harmonics are also involved with 60 Hz "hum". If a conventional state-of-the-art active notch filter were tuned to the 4th harmonic of 60 Hz, or 240 Hz, its approximately 30% bandwidth would cause an approximately 72 Hz band to be taken right out of the middle of the midrange. In contrast, the less than 7% bandwidth of the present invention tuned to 240 Hz would cause the removal of only a narrow band less than 17 Hz in width, and that will not register with any note on the chromatic scale. In fact, the present invention tuned to any of the 60 Hz harmonics will not register with any notes on the chromatic scale. It is to be noted, however, that above about 3,000 Hz the bandwidth of the invention will increase, but this would not be relevant to audible 60 Hz harmonics.

While the invention has been described with reference to presently preferred embodiments, it is to be understood that numerous modifications or alterations may be made by those skilled in the art without departing from the scope and spirit of the invention as set forth in the appended claims.

I claim:

1. A method of substantially eliminating a specific frequency from a first AC electrical signal, which comprises:

applying said first signal to a tuned circuit that is tuned to said specific frequency and is phase-responsive to frequency variations above and below said specific frequency so as to develop a second AC electrical signal that is in phase with said first signal only at substantially said specific frequency;

balancing the amplitudes of said first and second signals at said specific frequency; and applying said first and second signals as so balanced to the respective inputs of a differential amplifier that is responsive to input signal phase differences so as to substantially cancel said signals at substantially said specific frequency where they are in phase but not at frequencies above and below said specific frequency where they are not in phase.

2. The method of claim 1, wherein said specific frequency is 60 Hz or a harmonic thereof.

3. The method of claim 1, wherein said tuned circuit to which said first signal is applied is also amplitude-responsive to frequency variations above and below said specific frequency, and said differential amplifier to which said balanced signals are applied is also responsive to input signal amplitude differences.

4. The method of claim 3, wherein said tuned circuit to which said first signal is applied is an L/C parallel tuned circuit.

5. The method of claim 4, wherein the inductor component of said tuned circuit is a passive inductor.

6. The method of claim 4, wherein the inductor component of said tuned circuit is an active inductor.

7. The method of claim 1, wherein said amplitude balancing is accomplished by adjusting the amplitude of one of said signals to be equal to the amplitude of the other signal.

8. The method of claim 7, wherein it is the amplitude of said second signal that is adjusted.

9. The method of claim 8, wherein said amplitude adjustment is accomplished by means of a potentiometer.

10. The method of claim 9, which comprises isolating said tuned circuit from said potentiometer by means of a voltage follower to avoid loading of the tuned circuit by the potentiometer.

11. The method of claims 1 or 4, wherein said first signal is applied to said tuned circuit by applying said first signal across a voltage divider comprising a resistor and said tuned circuit, said second signal being developed at a voltage divider junction between said resistor and said tuned circuit.

12. The method of claim 1, wherein said specific frequency is substantially eliminated within a bandwidth of less than about 7% of said specific frequency.

13. The method of claim 1, wherein said specific frequency is attenuated to at least about 50 db.

14. The method of claim 1, wherein said specific frequency is attenuated within a response curve having slopes at least about 1,000 db per octave.

15. A notch filter system for substantially eliminating a specific frequency from a first AC electrical signal, which comprises:

an input terminal to which said first signal is applied, and an output terminal;

phase-responsive circuit means comprising a tuned circuit that is tuned to said specific frequency and is phase-responsive to frequency variations above and below said specific frequency, said phase-responsive circuit means having an output junction and being electrically connected to said input terminal for application of said first signal to said phase-responsive circuit means to develop a second AC electrical signal at said junction that is in phase with said first signal only at substantially said specific frequency;

a differential amplifier having first and second inputs and having an output that is connected to said output terminal, said differential amplifier being responsive to input signal phase differences;

first connection circuit means from said input terminal to said first amplifier input to deliver said first signal to said first amplifier input, and second connection circuit means from said junction to said second amplifier input to deliver said second signal to said second amplifier input; and balancing circuit means electrically connected to at least one of said connection circuit means for balancing the amplitudes of said first and second signals at said amplifier inputs at said specific frequency;

said differential amplifier substantially cancelling said signals at said output terminal at substantially said specific frequency where they are in phase but not at frequencies above and below said specific frequency where they are not in phase.

16. The system of claim 15, wherein said specific frequency is 60 Hz or a harmonic thereof.

17. The system of claim 15, wherein said phase-responsive circuit means is also amplitude-responsive to frequency variations above and below said specific frequency, and said differential amplifier is also responsive to input signal amplitude differences.

18. The system of claim 17, wherein said tuned circuit is an L/C parallel tuned circuit.

19. The system of claim 18, wherein the inductor-component of said tuned circuit is a passive inductor.

20. The system of claim 18, wherein the inductor component of said tuned circuit is an active inductor.

21. The system of claim 15, wherein said balancing circuit means is adjustable.

22. The system of claim 21, wherein said balancing circuit means is electrically connected to said second connection circuit means.

23. The system of claim 22, wherein said balancing circuit means comprises a potentiometer.

24. The system of claim 23, which comprises voltage follower means in said second connection circuit means between said phase-responsive circuit means and said potentiometer for isolating said tuned circuit from said potentiometer.

25. The system of claims 15 or 18, wherein said phase-responsive circuit means comprises a voltage divider comprising a resistor and said tuned circuit, said junction being located in said voltage divider between said resistor and said tuned circuit.

26. The notch filter system of claim 15 which has a bandwidth of less than about 7% of said specific frequency.

27. The notch filter system of claim 15 which has an attenuation at said specific frequency of at least about 50 db.

28. The notch filter system of claim 15 which has a response curve with slopes at least about 1,000 db per octave.

* * * * *